(12) United States Patent
Chan

(10) Patent No.: US 7,323,787 B2
(45) Date of Patent: Jan. 29, 2008

(54) OFF-GRID DECOUPLING OF BALL GRID ARRAY (BGA) DEVICES AND METHOD

(75) Inventor: Alex L. Chan, Nepean (CA)

(73) Assignee: Alcatel, Paris (FR)

( * ) Notice: Subject to any disclaimer, the term of this patent is extended or adjusted under 35 U.S.C. 154(b) by 382 days.

(21) Appl. No.: 11/041,727

(22) Filed: Jan. 25, 2005

(65) Prior Publication Data

US 2006/0166398 A1    Jul. 27, 2006

(51) Int. Cl.
*H01L 23/488* (2006.01)
*H01L 23/52* (2006.01)
*H01L 29/41* (2006.01)

(52) U.S. Cl. ............... 257/780; 257/738; 257/E23.06; 716/12; 716/15

(58) Field of Classification Search ............. 257/738, 257/780, E23.069; 716/12, 15
See application file for complete search history.

(56) References Cited

U.S. PATENT DOCUMENTS

2006/0110848 A1\* 5/2006 Brown .................. 438/106

\* cited by examiner

*Primary Examiner*—Mary Wilczewski
*Assistant Examiner*—Pamela E Perkins
(74) *Attorney, Agent, or Firm*—Jim Zegeer

(57) ABSTRACT

A multilayered printed wiring board having a ball grid array (BGA) land pattern in which each land in the pattern is connected to a respective via by a link connector, a method of adapting spacing between selected adjacent via and respective link pairs to receive decoupling capacitor pads, comprising rotating, elongating and/or truncating the selected adjacent pairs and rotating their respective corresponding via pairs to adapt the spacing between the selected adjacent via pairs in the BGA land pattern and applying the capacitor pads to the selected via pairs. The selected adjacent via pairs and their respective link connectors are rotated, elongated and/or truncated in mutually opposite directions.

3 Claims, 5 Drawing Sheets

OFF-GRID DECOUPLING OF BALL GRID ARRAY (BGA) DEVICES AND METHOD

BACKGROUND AND BRIEF DESCRIPTION OF THE INVENTION

The invention relates to the design of electronic circuit cards. Specifically, it is directed to electrically decoupling a BGA device with surface mount capacitors placed on the opposite side of the circuit card with respect to the BGA device and within the grid of vias and contacts used to route signal traces to the BGA device. This placement is motivated by the practice of placing decoupling capacitors as close as possible to the power and ground balls (pins) of the subject device for optimum electrical decoupling performance. Such placement is known in the art according to various techniques. However, each prior art technique has disadvantages relating to one or more of increased cost, reduced reliability, or increased constraints on the routing of signal traces within the BGA grid. The present invention therefore provides a new decoupling technique that mitigates the disadvantages of the prior art techniques discussed below.

Prior Art Solution No. 1

Referring to FIG. 1 and FIGS. 4A, 4B and 4C, LSI Logic has used shared vias on power and ground connections aligned in columns, in order to form a routing channel (i.e. a larger space between the row of shared vias and an adjacent row) through which connections can be routed. This is not a decoupling solution; however the assignee of this application has filed a patent application Ser. No. 10/761,343 in the USPTO on Jan. 22, 2004 entitled "Shared Via Decoupling for Area Arrays Components" on a solution that makes use of the shared via concept. FIG. 4 illustrates an example of this "shared-via" decoupling technique. The main drawback of the shared-via solution is that it is not always possible to share vias even though there are alternating power and ground rows. For example, in some cases the combined transient current of two power supply balls may exceed the limit for a via, in which case the two balls can not share a via, and consequently the shared-via decoupling technique for those balls can not be used.

Prior Art Solution No. 2.

Referring to FIGS. 2A and 2B, for 1.00 m pitch BGA components, one solution currently being used consists of plated through hole (PTH) used for via in pad (ViP) on the 0805 capacitor land pattern. The drawbacks of this solution are that the chip is required to have the power and ground balls configured in a very specific manner. The assumption in this case is that vias cannot be depopulated and that the capacitors must be connected as close as possible to the power and ground balls. FIG. 2 shows that in order for an 0805 capacitor to fit into the back side of a 1.00 mm grid, the power and ground balls that require decoupling need to be separated by either a signal or unused ball. In some applications this separation does not exist because of the pin-out of the BGA device, which may have been dictated by other constraints such as signal routing limitations, transient current limitations, etc.

Prior Art Solution No. 3

Referring to FIGS. 3A and 3B, another solution currently employed in recent designs, uses advanced printed wiring board (PWB) technology. This solution uses a combination of blind and sub-composite vias to allow access on the backside of the BGA component. In this case, component pitch, pin arrangement and capacitor size do not need to be specified and should work for many combinations. As a result, a "parking lot" like arrangement can be formed on the backside of a BGA component to maximize the number of decoupling capacitors that can fit into the available space. This option provides the highest degree of freedom for the design but results in higher board costs.

Prior Art Solution No. 4

Another technique is known as filled via. In this case, two adequately spaced apart through-hole (through board) vias are filled with conductive or non-conductive materials followed by a plating process so that each can act as a landing pad for an end of a surface mount decoupling capacitor. The capacitor is then electrically and mechanically connected to the circuit card by soldering it to the landing pads. A drawback to this technique is the possibility of a via becoming delaminated from the circuit card due to the differences in thermal expansion of the thin copper via, the materials used to fill the via, and the FR4 material used between copper layers of the circuit card. The process is considered to be high risk in the industry today with very limited sourcing. Additional to this reliability risk this technique is also adds about 30-40% to the cost of the circuit card.

In the order of the prior art discussed above, summarizing the main drawbacks of the above prior art solutions include the following:

1. The main drawback of the shared-via decoupling solution (Prior art No. 1) is that it can not be used in some applications, e.g. if transient currents are too high to share vias.
2. The main drawback of the plated through hole (PTH) Via in Pad (ViP) solution (Prior Art No. 2) is also that it is not applicable in some applications, e.g. when power, ground and signals balls (pins) cannot be arranged in the required pattern, i.e. power-signal-ground. Also, with that technique there is no test access for the signal pin under the decoupling capacitor and PTH ViP has caused some problems during x-ray inspection of circuit cards.
3. The main drawback to the "parking lot" solution (Prior Art No. 3), using High Density Interconnect (HDI) is the high cost of manufacturing the circuit card due to the blind and sub-composite vias used by the technique.
4. The drawbacks of the "filled via" solution (Prior Art No. 4) are the resulting increased reliability risk of filled vias becoming delaminated from the circuit card and the increased cost of the circuit card.

THE PRESENT INVENTION

The basic feature of the present invention is to move the placement of two adjacent rows, or portions of rows, of power and ground vias away from each other, thereby departing from the standard grid pitch to create enough available space between the rows to mount a decoupling capacitor between two diagonally opposed vias, each via being in a respective adjacent row.

The invention is directed to a method and apparatus for providing a circuit card having decoupling capacitor soldering pads within a regularly spaced grid of ball grid array soldering pads on the opposite side of the circuit card as that of the decoupling capacitor soldering pads. Adequate spacing to mount a decoupling capacitor between a pair of decoupling capacitor soldering pads that are diagonally opposed to each other in relation to the ball grid array has been attained by a linear shift in placement of one or both of said pads along an axis that is parallel to said diagonal opposition of said pads, and each one of the pair being substantially in respective adjacent rows or columns of said array and electrically connected to a respective through-board via connected to one of said ball grid array soldering pads. A CAD tool may be used for practicing the method according to the invention.

The invention features a ball grid array (BGA) device and its respected land pattern on a multilayered printed wiring board in which each land in the pattern is connected to a respective via by a link connector and a method of adapting spacing between selected adjacent via and respective pairs to receive decoupling capacitor pads, comprising: rotating, elongating and/or truncating said selected adjacent link pairs and rotating their respective corresponding via pairs to adapt the spacing between the selected adjacent via pairs in the BGA land pattern and applying the capacitor pads to the selected via pairs. Moreover, the selected adjacent via pairs and their respective link connectors are rotated, elongated and/or truncated in mutually opposite directions.

The invention also features a printed wiring board in which via and link connector pattern has been modified in accordance with the method described above.

The object of the invention is to provide a method and apparatus for a circuit card having decoupling capacitor soldering pads within a regularly spaced grid of a ball grid array soldering pads.

BRIEF DESCRIPTION OF THE DRAWINGS

The above and other objects, advantages and features of the invention will become more apparent when considered with the following specification and accompanying drawings wherein.

DETAILED DESCRIPTION OF THE INVENTION

Figure 1:
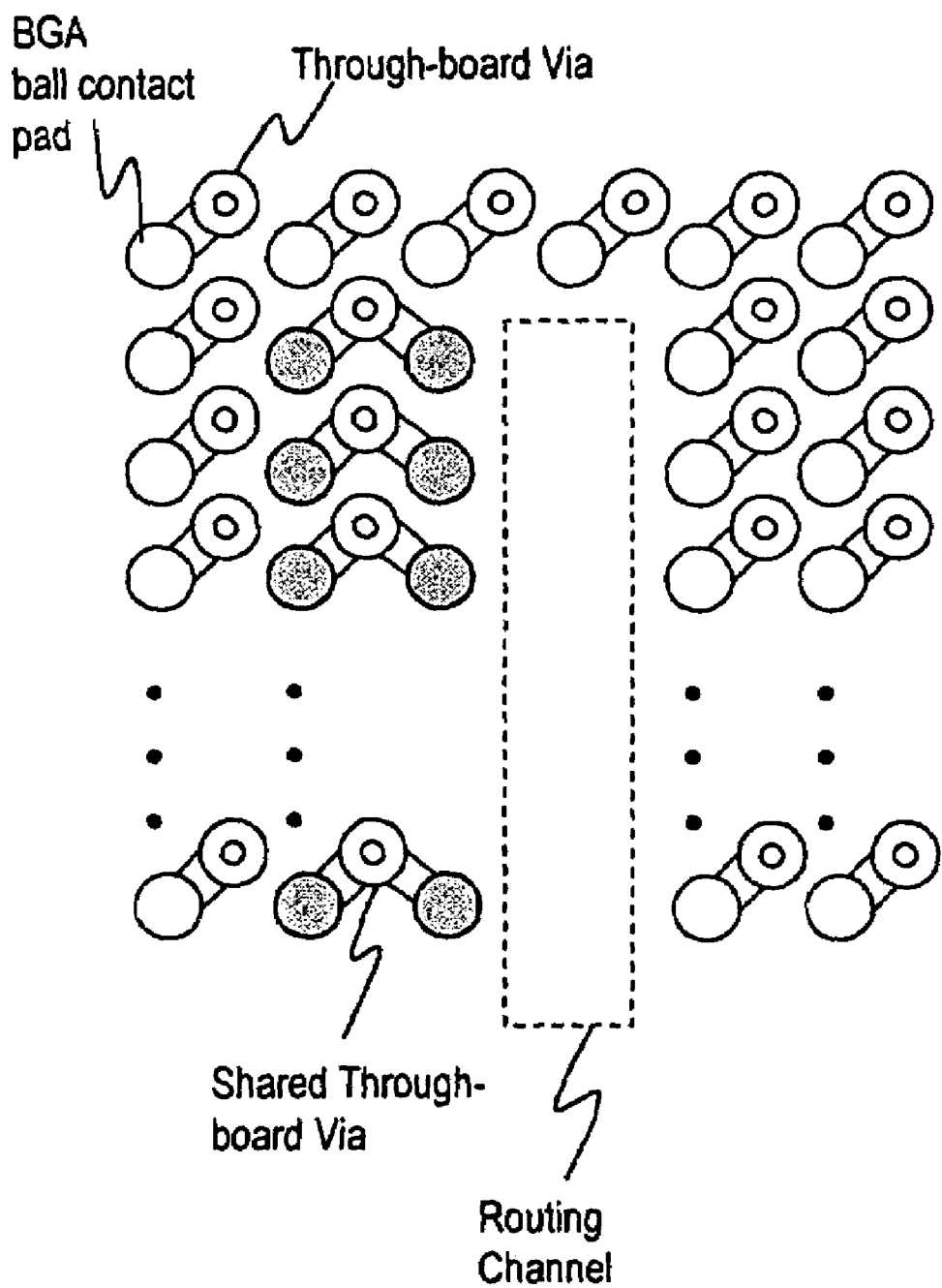
FIG. 1 (taken with FIGS. 4A, 4B and 4C) illustrates the shared vias that create a routing channel and designated herein as Prior Art No. 1.
Figure 2:
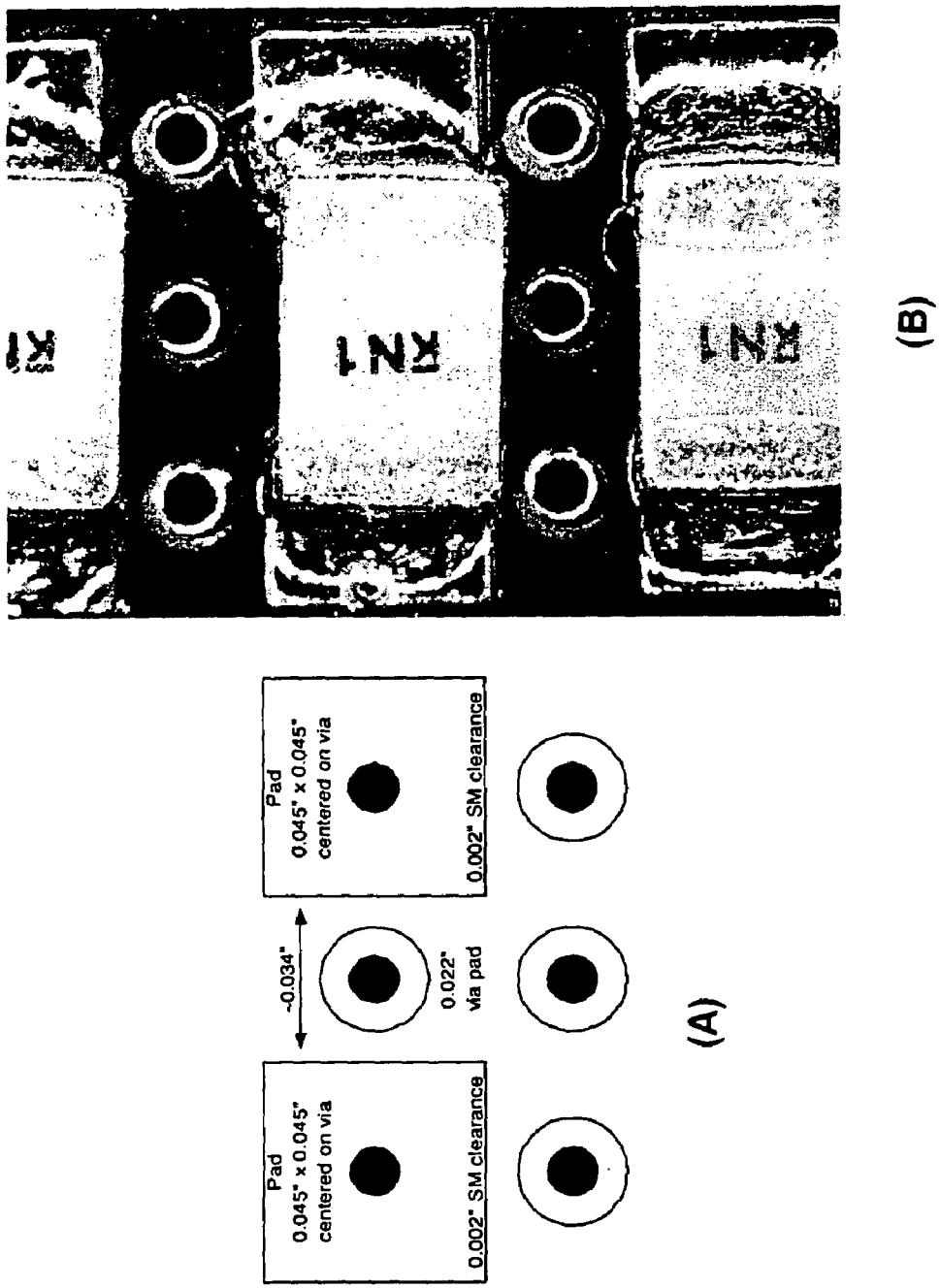
FIGS. 2A and 2B illustrate the capacitor with the plated through hole ViP solution and designated herein as Prior Art No. 2.
Figure 3:
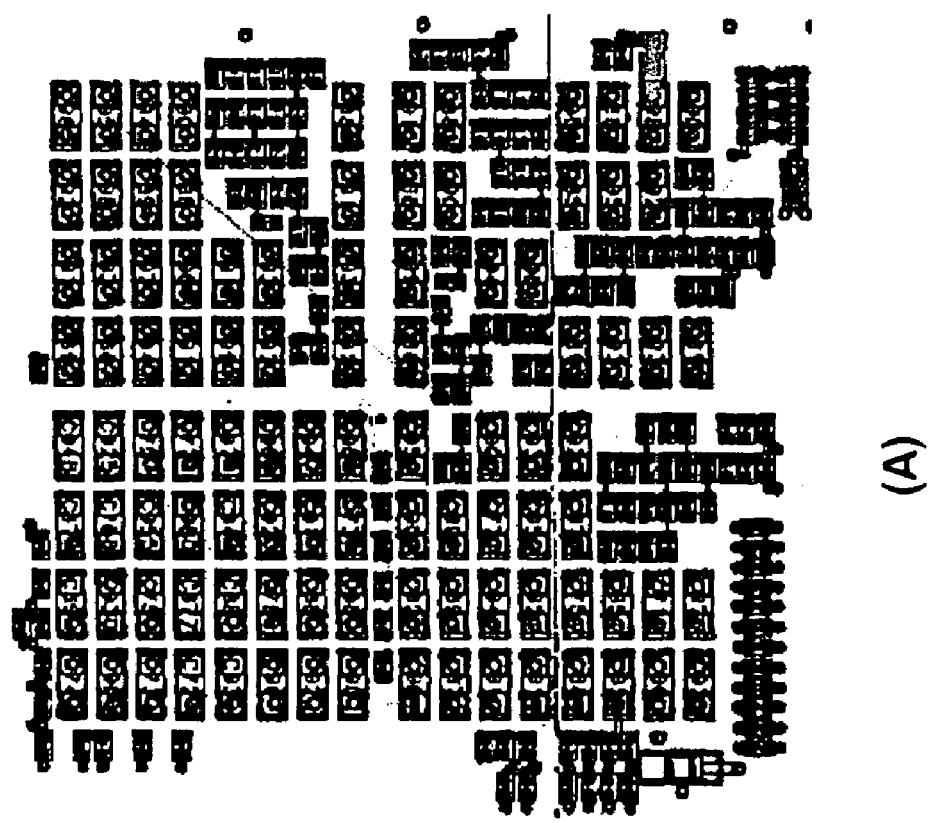
FIGS. 3A and 3B illustrate the HDI "parking lot" solution and designated herein as Prior Art No. 3.
Figure 4:
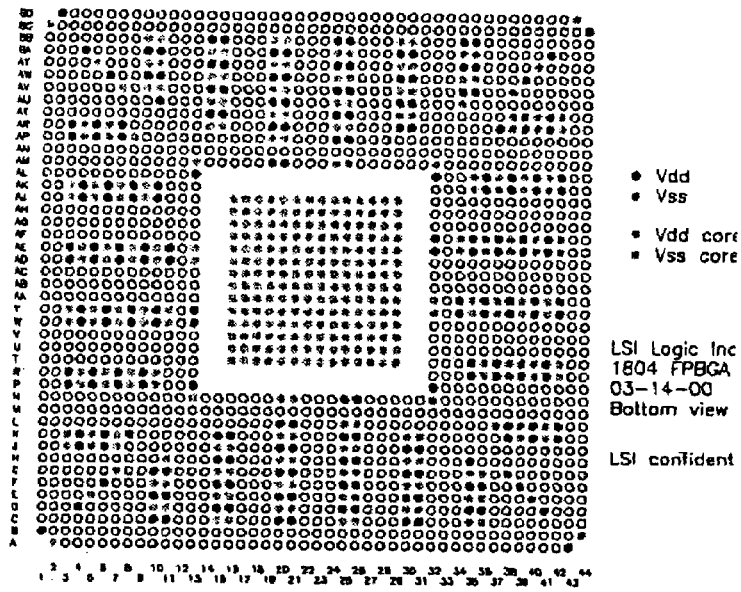
FIGS. 4A, 4B and 4C further illustrate the shared via solution shown in FIG. 1.
Figure 4:
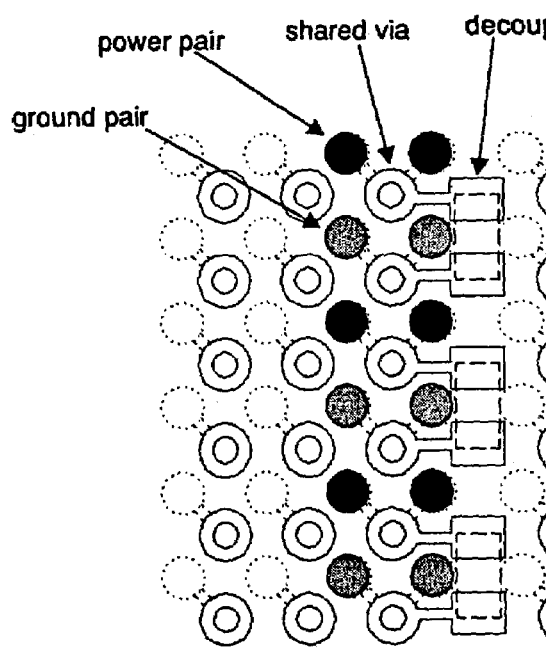
Figure 4:
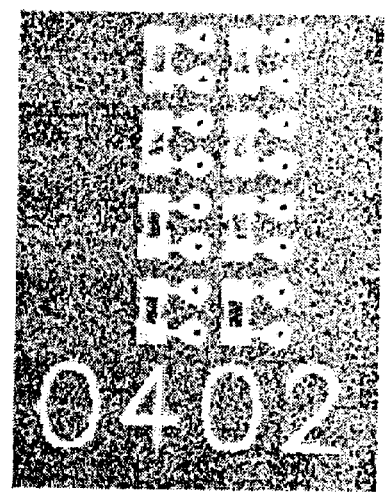
Figure 5:
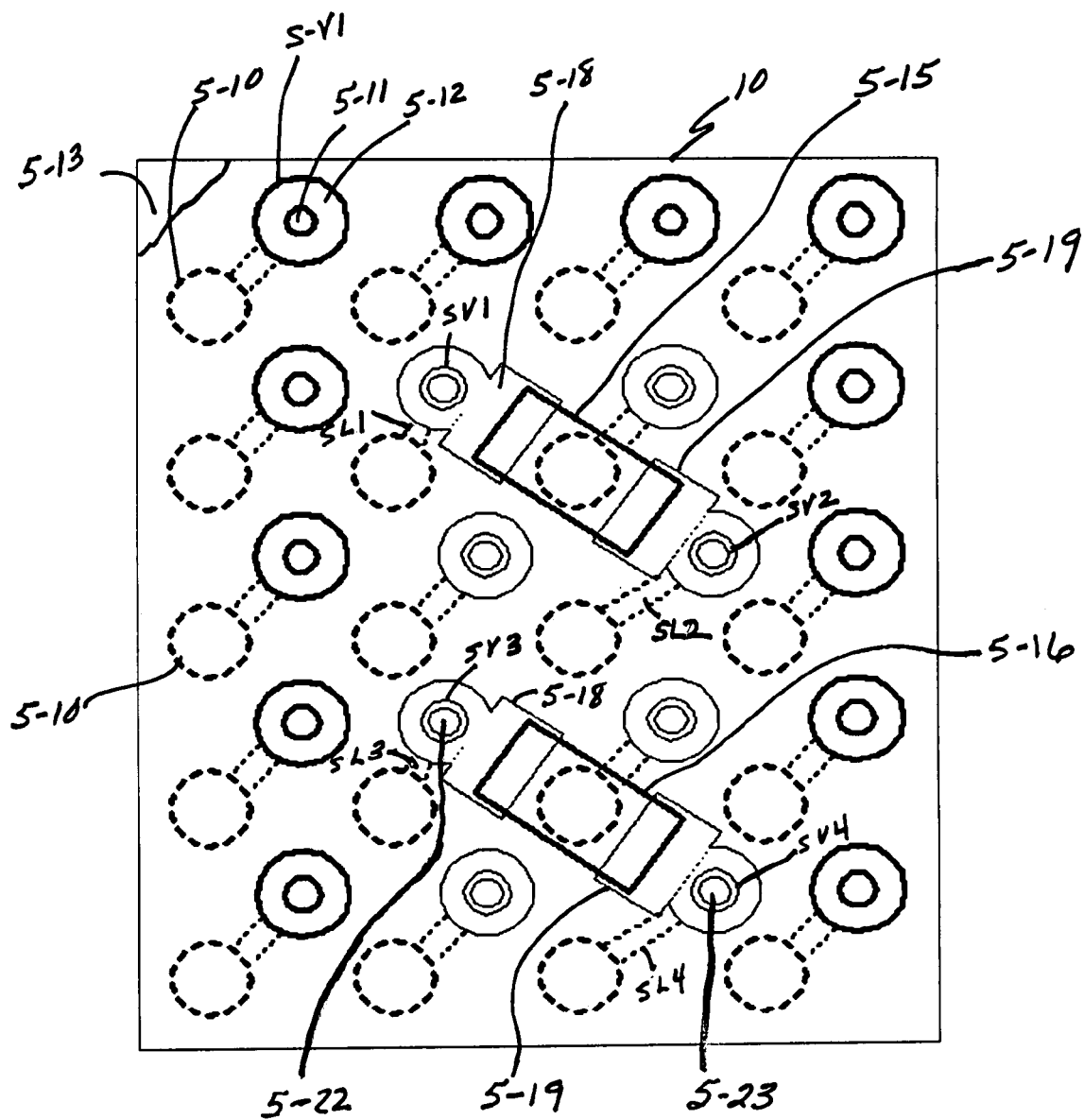
FIG. 5 is an illustration of the printed circuit board of the off-grid decoupling technique incorporating the invention.

Referring to FIG. 5, a multilayered printed wiring board 10 has circular lands or pads 5-10 (on the device side, or top side) in the conventional BGA grid pattern for mounting the BGA devices are shown in dashed line. The solder mask 5-13 is shown partially in FIG. 5. Each via 5-V1, 5-V2 . . . 5-VN, which penetrate the printed wiring board and appear on both sides, is shown as an inner circle 5-11 having an inner part representing the through-board hole of the via and an outer part 5-12 representing surface copper of the via. Two rectangular capacitors 5-15, 5-16 are shown in outline mounted onto the copper pads 5-18, 5-19 mounted diagonally with respect to the BGA grid, on the opposite side to the BGA device (or bottom side), and between two adjacent rows of vias. The placement of the vias to which the capacitors have been mounted have been shifted diagonally apart, with respect to the BGA grid, to accommodate the capacitors. Links 5-L connect the vias 5-V to their respective pads 5-10. At the via locations, selected for a decoupling capacitor, vias VS1, VS2, are diagonally situated relative to each other and their respective links SL1 and SL2 have been shortened (SL1) and/or lengthened (SL2). Note further that they have been rotated (clockwise and counterclockwise) relative to each other. The same goes for selected vias V5-3 and V5-4 and the links SL3 and SL4. These vias also have a small through hole 5-22, 5-23 inside which are separated from the solder and the soldered capacitor by a solder mask. Note that a circuit routing or trace channel still remains between the shifted vias and the non-shifted vias, which remain on the BGA grid pitch.

Details of the exact amount of shifting for various grid pitches and capacitor sizes (e.g. 0402) vary according to size.

ADVANTAGES OF THE INVENTION enables a high density of decoupling capacitors to be mounted on the backside of a circuit card using standard plated through hole (PTH) technology, useful for low count I/O devices where routing between rows of the ball grid array is less constrained (e.g. memory devices such as the CAMs) and for some high count I/O devices as well, viable solution for applications that can't use the shared-via technique, and at the same cost and reliability as that technique, and less costly and/or higher reliability than the other three prior art solutions (PTH ViP, parking lot with HDI, and filled via).

While the invention has been described in relation to preferred embodiments of the invention, it will be appreciated that other embodiments, adaptations and modifications of the invention will be apparent to those skilled in the art.

What is claimed is:

1. In a multilayered printed wiring board, a ball grid array (BGA) land pattern in which each land in said pattern is connected to a respective via by a link connector, a method of adapting spacing between selected adjacent via and respective link pairs to receive decoupling capacitor pads, comprising:

rotating, elongating and/or truncating said selected adjacent link pairs and rotating their respective corresponding via pairs to adapt the spacing between said selected adjacent via pairs in said BGA land pattern and applying said capacitor pads to said selected via pairs.

2. The method defined in claim 1 wherein said selected adjacent via pairs and their respective link connectors are rotated, elongated and/or truncated in mutually opposite directions.

3. A printed wiring board in which via and link connector pattern has been modified in accordance with the method described in claim 1.

* * * * *